(12) United States Patent
Yun

(10) Patent No.: US 11,862,442 B2
(45) Date of Patent: Jan. 2, 2024

(54) PLASMA PROCESS MONITORING DEVICE AND PLASMA PROCESSING APPARATUS INCLUDING THE SAME

(71) Applicant: INDUSTRY-ACADEMIC COOPERATION FOUNDATION, YONSEI UNIVERSITY, Seoul (KR)

(72) Inventor: Il Gu Yun, Seoul (KR)

(73) Assignee: INDUSTRY-ACADEMIC COOPERATION FOUNDATION, YONSEI UNIVERSITY, Seoul (KR)

(*) Notice: Subject to any disclaimer, the term of this patent is extended or adjusted under 35 U.S.C. 154(b) by 0 days.

(21) Appl. No.: 16/412,818

(22) Filed: May 15, 2019

(65) Prior Publication Data
US 2019/0355559 A1 Nov. 21, 2019

(30) Foreign Application Priority Data
May 16, 2018 (KR) .................. 10-2018-0056161

(51) Int. Cl.
*H01J 37/32* (2006.01)
*H01L 21/67* (2006.01)
*G01J 1/44* (2006.01)
*G01J 3/443* (2006.01)

(52) U.S. Cl.
CPC .......... *H01J 37/32944* (2013.01); *G01J 1/44* (2013.01); *G01J 3/443* (2013.01); *H01L 21/67253* (2013.01); *H01J 2237/24507* (2013.01)

(58) Field of Classification Search
USPC ....................... 156/345.24–345.28
See application file for complete search history.

(56) References Cited

U.S. PATENT DOCUMENTS 5,432,526 A * 7/1995 Hyatt .................. B60R 16/0373
345/87
2007/0284044 A1* 12/2007 Matsumoto ............ G01N 21/68
156/345.29

(Continued)

FOREIGN PATENT DOCUMENTS

KR   10-2007-0003364 A   1/2007
KR   10-2017-0029892 A   3/2017
KR   10-2018-0014349 A   2/2018

OTHER PUBLICATIONS

Office Action of Korean Application No. 10-2018-0056161 dated Apr. 16, 2019.

(Continued)

*Primary Examiner* — Parviz Hassanzadeh
*Assistant Examiner* — Nathan K Ford
(74) *Attorney, Agent, or Firm* — Sughrue Mion, PLLC

(57) ABSTRACT

A plasma process monitoring device capable of monitoring plasma light distributed in a certain area in a chamber includes a selection area light transmitter and a monitor. The selection area light transmitter is disposed to face a viewport formed in a chamber and includes a plurality of selective light blockers for selectively blocking plasma light emitted through the viewport. The monitor receives plasma light transmitted through at least one of a plurality of selective light blockers to acquire information on the plasma light, and monitors the uniformity of plasma generated in the chamber based on the information on the plasma light.

8 Claims, 11 Drawing Sheets

(56) References Cited

U.S. PATENT DOCUMENTS

| | | | |
|---|---|---|---|
| 2008/0121911 A1* | 5/2008 | Andrews | H01L 33/58 257/98 |
| 2011/0056272 A1* | 3/2011 | McNally | H01J 37/32935 73/24.02 |
| 2011/0292018 A1* | 12/2011 | Kubota | G09G 3/3426 345/211 |
| 2015/0024147 A1* | 1/2015 | Lee | C23C 16/5096 427/569 |
| 2016/0094011 A1* | 3/2016 | Deng | G01J 1/44 250/372 |
| 2016/0181165 A1* | 6/2016 | Samara | H01J 37/32935 438/16 |
| 2016/0300699 A1* | 10/2016 | Kim | G01J 3/443 |
| 2016/0379802 A1* | 12/2016 | Oh | H01J 37/32972 156/345.24 |
| 2017/0067779 A1* | 3/2017 | Kim | G02B 5/205 |
| 2017/0254755 A1* | 9/2017 | Cho | G01J 3/0229 |
| 2018/0166301 A1* | 6/2018 | Chang | H01J 37/32082 |
| 2018/0298488 A1* | 10/2018 | Sakata | C23C 14/52 |
| 2020/0373210 A1* | 11/2020 | Chen | G01N 21/8806 |

OTHER PUBLICATIONS

Communication dated May 21, 2021, issued by the Chinese Patent Office in counterpart Chinese Application No. 201910387865.0.

* cited by examiner

130

331a

331b

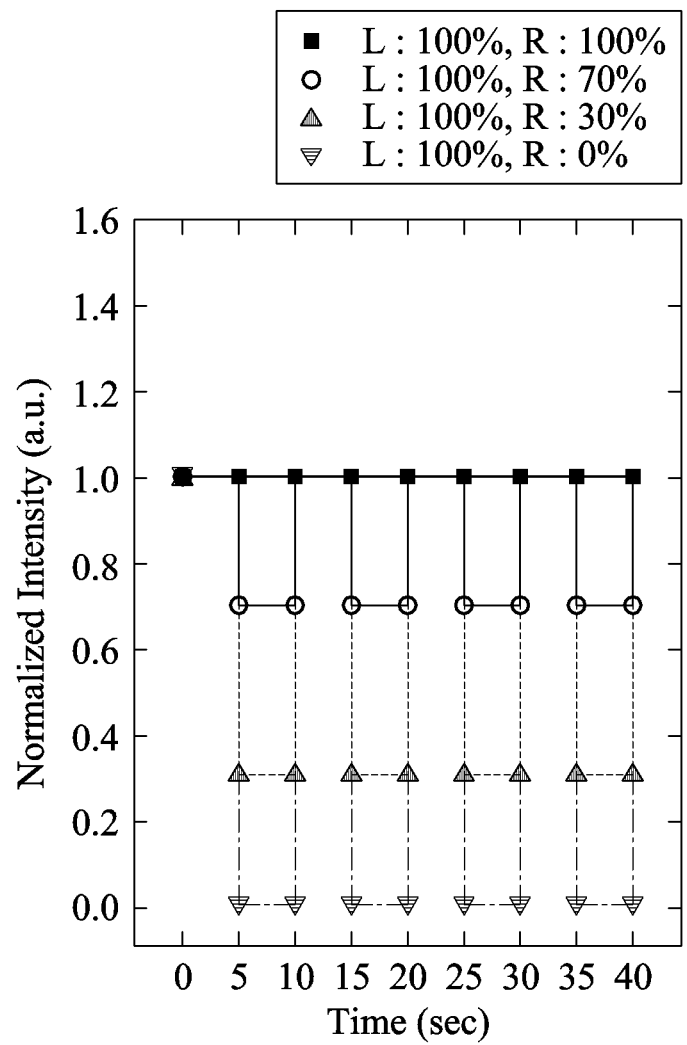

PLASMA PROCESS MONITORING DEVICE AND PLASMA PROCESSING APPARATUS INCLUDING THE SAME

CROSS-REFERENCE TO RELATED APPLICATION

This application claims priority to Korean Patent Application No. 10-2018-0056161, filed on May 16, 2018 in the Korean Intellectual Property Office, the disclosure of which is incorporated herein by reference.

BACKGROUND OF THE DISCLOSURE

Field of the Disclosure

The present disclosure relates to a plasma process monitoring device for detecting plasma uniformity and occurrence of an abnormal state in a plasma process used for etching or deposition of semiconductors and a plasma processing apparatus including the plasma process monitoring device. More particularly, the present disclosure relates to a plasma process monitoring device including a selection area light transmitter disposed between a viewport and a monitor for selectively transmitting and blocking plasma light for each area emitted through the viewport, and to a plasma processing apparatus including the plasma process monitoring device. According to the present disclosure, plasma uniformity and occurrence of an abnormal state such as arc discharge inside a chamber may be monitored.

Description of the Related Art

In general, semiconductor wafers or substrates used in various display devices (hereinafter referred to as substrates) are fabricated by forming a thin film on a substrate and repeating a substrate processing process (e.g., a process of partially etching the thin film).

The process of forming a thin film is generally performed using a chemical vapor deposition (CVD) method or a plasma-enhanced chemical vapor deposition (PECVD) method. Here, a plasma apparatus used for plasma-enhanced chemical vapor deposition generally includes a chamber providing a reaction space, a gas feeder for supplying reaction gas to the chamber, a power supply for supplying power to the gas feeder, and a chuck on which a substrate is placed.

To form a thin film having a uniform thickness during plasma-enhanced chemical vapor deposition, monitoring of the state of plasma is very important. However, in the case of conventional plasma process monitoring devices, even when plasma is concentrated in a specific space in a chamber, only the concentration of total plasma in the chamber can be measured. Therefore, there has been a limitation in measuring the uniformity of plasma in real time.

SUMMARY OF THE DISCLOSURE

Therefore, the present disclosure has been made in view of the above problems, and it is an object of the present disclosure to provide a plasma process monitoring device including a selection area light transmitter disposed between a viewport and a monitor for selectively transmitting and blocking plasma light for each area emitted through the viewport. The plasma process monitoring device allows monitoring of the plasma uniformity and occurrence of an abnormal state of arc discharge inside a chamber. Therefore, a substrate having a uniform thickness may be fabricated, and at the same time, damage to the substrate due to arc discharge may be prevented.

One aspect of the present disclosure provides a plasma process monitoring device including a selection area light transmitter and a monitor. The selection area light transmitter is disposed to face a viewport formed in a chamber and includes a plurality of selective light blockers for selectively blocking plasma light emitted through the viewport. The monitor receives plasma light transmitted through at least one of a plurality of selective light blockers to acquire information on the plasma light, and monitors the uniformity of plasma generated in the chamber based on the information on the plasma light.

According to one embodiment, the selective light blockers may be arranged in parallel in the horizontal or vertical direction.

According to one embodiment, the selective light blockers may be formed in a rectangular shape.

According to one embodiment, the information may include the intensity or quantity of plasma light transmitted through the selective light blockers.

According to one embodiment, the selection area light transmitter may include a transparent LCD panel and a switch. The transparent LCD panel may include one or more LCD panel units, each being divided into one or more areas and powered individually, and may be formed so that plasma light is transmitted only through the area to which power is supplied. The switch may be connected to the transparent LCD panel, and may be responsible for selectively supplying power to specific areas of each of the LCD panel units.

According to one embodiment, the selection area light transmitter may include a frame and shutter members. The frame is disposed to face the viewport and has an opening. The shutter members are provided in plural and arranged in a line in the frame, and selectively shield a certain area of the opening.

According to one embodiment, the selection area light transmitter may include a plurality of sets of polarizing filters and a controller. Each of the sets of polarizing filters may include two or more polarizing filters arranged so as to overlap each other, and may be formed so that plasma light is selectively transmitted therethrough. The controller controls the arrangement angle of at least one of the polarizing filters provided in the set of polarizing filters to selectively block plasma light incident on the set of polarizing filters.

According to one embodiment, the selection area light transmitter may be formed on one side of the viewport to be integrated with the viewport.

According to one embodiment, plasma light may be sequentially transmitted in one direction through the selective light blockers.

According to one embodiment, the monitor may include an optical fiber or a measurement sensor to monitor the intensity or quantity of plasma light.

According to one embodiment, the monitor may include an optical emission spectroscope (OES) or a camera.

According to one embodiment, the monitor may receive information on plasma light transmitted through each of the selective light blockers and compare the received information to determine the uniformity of plasma generated in the chamber.

According to one embodiment, the monitor may further include a photographing module for photographing the arc discharge state of plasma light transmitted through the selective light blockers.

According to one embodiment, a condenser for extending and focusing the range of the angle of incidence of plasma light emitted from the inside of the chamber and providing the extended and focused range to the monitor may be further installed between the selection area light transmitter and the monitor.

Another aspect of the present disclosure provides a plasma processing apparatus including a chamber, a viewport, a selection area light transmitter, and a monitor. In the chamber, a process using plasma is performed. The viewport is installed in the chamber, and plasma light emitted from the inside of the chamber is transmitted to the outside through the viewport. The selection area light transmitter is disposed to face the viewport, and includes a plurality of selective light blockers for selectively blocking plasma light emitted through the viewport. The monitor receives plasma light transmitted through at least one of the selective light blockers to acquire information on the plasma light, and monitors the uniformity of plasma generated in the chamber based on the information.

According to one embodiment, the light transmitter may include a plurality of selective light blockers arranged in parallel in the horizontal or vertical direction and having a rectangular shape.

According to one embodiment, the information on plasma light may include the intensity or quantity of plasma light transmitted through the selective light blockers.

According to one embodiment, the selection area light transmitter may include a transparent LCD panel and a switch. The transparent LCD panel may include one or more LCD panel units, each being divided into one or more areas and powered individually, and may be formed so that plasma light is transmitted only through an area to which power is supplied. The switch may be connected to the transparent LCD panel, and may selectively supply power to specific areas of each of the LCD panel units.

According to one embodiment, the selection area light transmitter may include a frame and shutter members. The frame may be disposed to face the viewport, and may have an opening. The shutter members may be provided in plural, and may be arranged in a line in the frame to selectively shield a certain area of the opening.

According to one embodiment, the selection area light transmitter may include a plurality of sets of polarizing filters and a controller. Each of the sets of polarizing filters may include two or more polarizing filters arranged so as to overlap each other, and may be formed so that plasma light is selectively transmitted therethrough. The controller controls the arrangement angle of at least one of the polarizing filters provided in the set of polarizing filters to selectively block plasma light incident on the set of polarizing filters.

BRIEF DESCRIPTION OF THE DRAWINGS

The above and other objects, features and other advantages of the present disclosure will be more clearly understood from the following detailed description taken in conjunction with the accompanying drawings, in which:

FIG. 11B is a graph showing plasma light intensities over time measured using a plasma process monitoring device according to the present disclosure including two selection area light transmitters.

DETAILED DESCRIPTION OF THE DISCLOSURE

Figure 1:
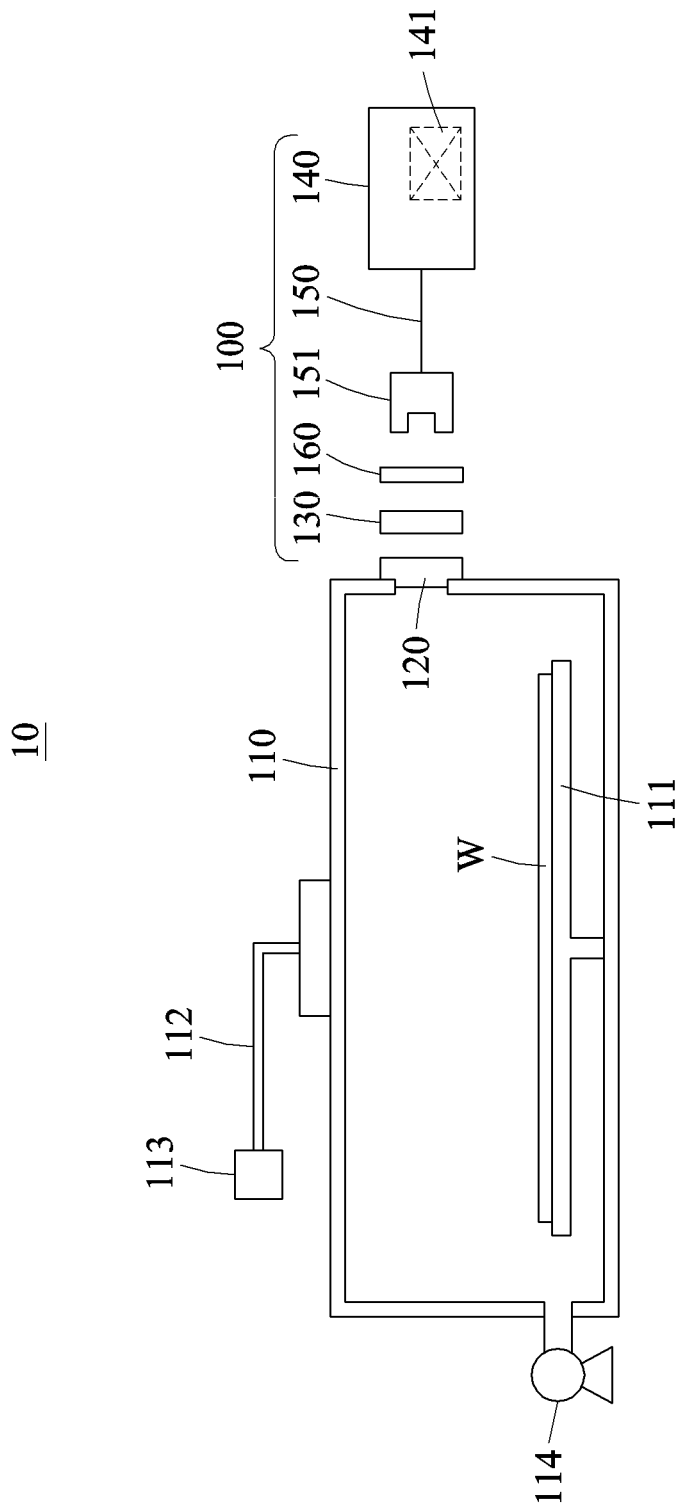
FIG. 1 is a schematic block diagram of a plasma process monitoring device according to one embodiment of the present disclosure and a plasma processing apparatus including the same.

Hereinafter, a plasma process monitoring device and a plasma process chamber according to preferred embodiments will be described in detail with reference to the accompanying drawings. Here, when reference numerals are applied to constituents illustrated in each drawing, it should be noted that like reference numerals indicate like elements throughout the specification. In the following description of the present disclosure, a detailed description of known functions and configurations incorporated herein will be omitted when it may make the subject matter of the present disclosure unclear. Embodiments of the present disclosure are provided to more fully describe the present disclosure to those skilled in the art. Accordingly, the shape and size of elements in the drawings may be exaggerated for clarity.

Figure 2:
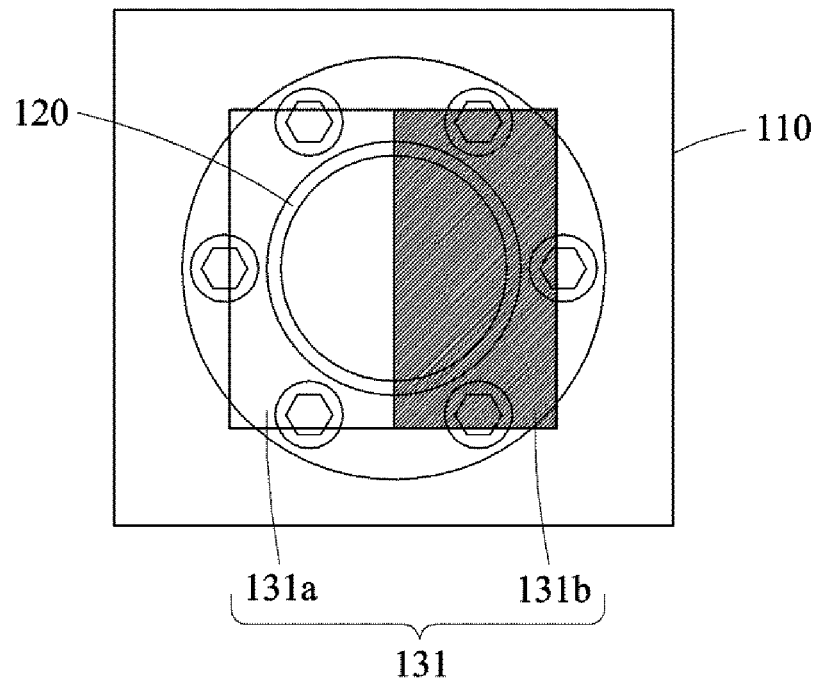
FIG. 2 is an enlarged view of the viewport of the plasma processing apparatus shown in FIG. 1.
Figure 3:
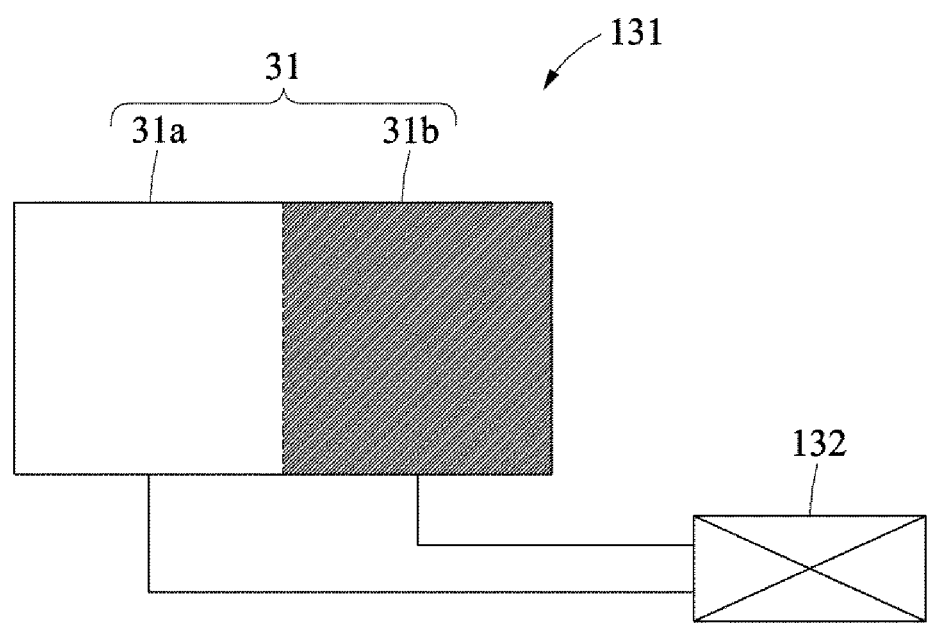
FIG. 3 is a block diagram of the selection area light transmitter shown in FIG. 1.
Figure 4A:
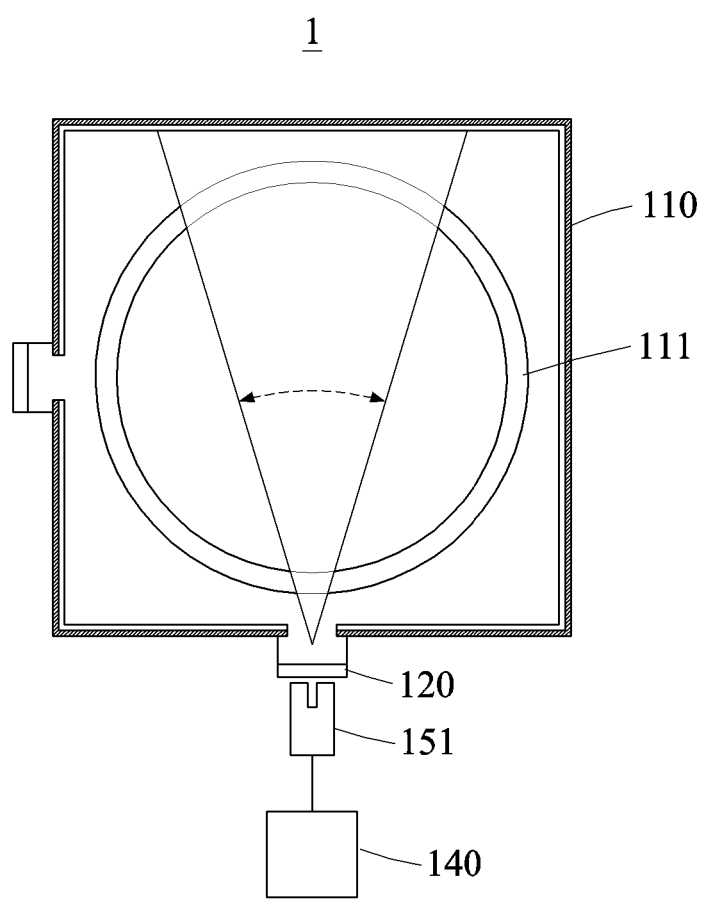
FIG. 4A is a top view of a conventional plasma processing apparatus in which a selection area light transmitter is not installed.
Figure 4B:
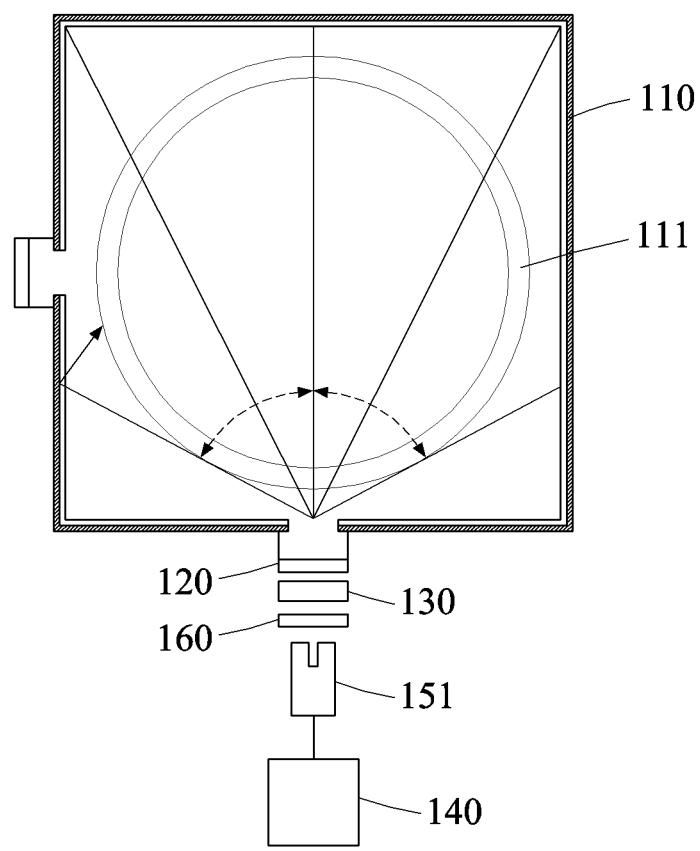
FIG. 4B is a top view of the plasma processing apparatus shown in FIG. 1.

FIG. 1 is a schematic block diagram of a plasma process monitoring device according to one embodiment of the present disclosure and a plasma processing apparatus including the same, FIG. 2 is a side view of the plasma processing apparatus shown in FIG. 1, and FIG. 3 is a block diagram of the selection area light transmitter shown in FIG. 1. FIG. 4A is a top view of a conventional plasma processing apparatus in which a selection area light transmitter is not installed, and FIG. 4B is a top view of the plasma processing apparatus shown in FIG. 1.

As shown in FIGS. 1 to 4, a plasma process monitoring device 100 is installed in a chamber 110 provided with a viewport 120, and includes a selection area light transmitter 130 and a monitor 140.

The selection area light transmitter 130 may be disposed to face the viewport 120 formed in the chamber 110, and may include a plurality of selective light blockers 131 for selectively blocking or transmitting plasma light emitted through the viewport 120.

The viewport 120 is divided into several areas by the selective light blockers 131 and plasma light is alternately blocked or transmitted so that the intensity or quantity of plasma light for each area in the chamber 110 may be measured. Here, the size of the selective light blockers 131 is not limited, but the selective light blockers 131 are preferably formed to have a size allowing a minimum quantity of plasma light to pass therethrough.

The selective light blockers 131 may be arranged in parallel in the horizontal or vertical direction, and each of the selective light blockers 131 may be formed in a rectangular shape. In addition, to accurately measure plasma uniformity, the selective light blockers 131 are preferably arranged so as to be in close contact with each other such that no gaps are formed therebetween.

Referring to FIG. 3, the selection area light transmitter 130 may include a transparent LCD panel 131 and a switch 132.

The transparent LCD panel 131 may be disposed to face the viewport 120. The transparent LCD panel 131 includes one or more LCD panel units 31, each being divided into one or more areas 31a and 31b and powered individually. In addition, the transparent LCD panel 131 may be formed so that plasma light is transmitted only through an area to which power is supplied.

That is, when power is applied to the transparent LCD panel 131, which is a kind of transparent film, the liquid crystal material inside the transparent LCD panel 131 is scattered, which causes light scattering. Thus, in the transparent LCD panel 131, coloring (i.e., contrast) may be controlled using this phenomenon. In the present disclosure, a simplified LCD panel in which contrast is adjusted only in black is preferably used.

Each of the areas 31a and 31b of each of the LCD panel units 31 constituting the transparent LCD panel 131 may be individually connected to a power source so that contrast may be adjusted in black in each area. That is, although the LCD panel unit 31, which serves as a selective light blocker, is shown as being divided into two areas 31a and 31b in FIG. 3, the number of the divided areas is not limited thereto, and the LCD panel unit 31 may be divided into one or more areas. When the LCD panel unit 31 has one area, the LCD panel unit 31 may be provided in plural, and the LCD panel units 31 may be connected to each other to form the transparent LCD panel 131. In this case, the size of the areas 31a and 31b of the LCD panel unit 31 is not limited, and the areas 31a and 31b are preferably formed to have a size allowing a minimum quantity of plasma light to pass therethrough.

The switch 132 may be connected to the transparent LCD panel 131, and may selectively supply power to each of the areas 31a and 31b of the LCD panel unit 31. Accordingly, contrast in each of the areas 31a and 31b of the LCD panel unit 31 may be individually adjusted by controlling the switch 132. For example, as shown in FIG. 3, when the transparent LCD panel 131 includes one LCD panel unit 31, the area of which is divided into two areas 31a and 31b, when power is applied only to the area 31a disposed on the left side of the LCD panel unit 31 through the switch 132, the contrast in the area 31a is adjusted to be transparent so that plasma light is transmitted through the area 31a, and the contrast in the area 31b disposed on the right side of the LCD panel unit 31 is adjusted to be black so that plasma light is blocked.

Therefore, plasma light transmitted through the viewport 120 is not transmitted through the area 31b disposed on the right side, but is transmitted only through the area 31a disposed on the left side. That is, the quantity of light passing through the area 31b disposed on the right side is 0%, and the quantity of light passing through the area 31a disposed on the left side is 100%.

The monitor 140 receives plasma light transmitted through at least one of the selective light blockers 131 to acquire information on the received plasma light, and monitors the uniformity of plasma generated in the chamber 110 based on the acquired information on the plasma light. In this case, the information on plasma light may include information on the intensity and quantity of plasma light transmitted through the selective light blockers 131.

The monitor 140 may be disposed outside of the chamber 110, and may be connected to the selection area light transmitter 130 via an optical cable 150 having an optical probe 151. Specifically, the optical probe 151 may be disposed close to the selection area light transmitter 130, and may be optically connected to the monitor 140 via the optical cable 150. Accordingly, the monitor 140 may analyze plasma light transmitted via the optical probe 151 and the optical cable 150. For example, the optical cable 150 may be formed of optical fiber.

The monitor 140 may be an apparatus, e.g., an optical emission spectroscope (OES), having an optical fiber for monitoring the intensity or quantity of plasma light. The optical emission spectroscope may detect light using the discontinuous electron energy levels of atoms and ions, i.e., may detect light emitted when electrons in a relatively high energy state transition to a relatively low energy state. However, the type of the monitor 140 is not limited to the optical emission spectroscope (OES), and the monitor 140 may include a camera for monitoring the intensity or quantity of plasma light.

In addition, the monitor 140 may include a measurement sensor for measuring the intensity or quantity of plasma light therein, and may monitor the intensity or quantity of plasma light. When the monitor 140 includes the measurement sensor, the monitor 140 may be directly connected to the optical probe 151 without an optical fiber, i.e., the optical cable 150, and may monitor the intensity or quantity of plasma light transmitted through the selection area light transmitter 130.

Analysis of the plasma light of a specific area transmitted through the selection area light transmitter 130 by the monitor 140 enables detection of an abnormal state of plasma according to positions in the chamber 110 and spatial interpretation of the plasma state. In addition, the monitor 140 may receive information on plasma light transmitted through each of the selective light blockers 131 and compare the received information, and based on the information, may determine the uniformity of distribution of plasma generated in the chamber 110.

In addition, a condenser 160 for extending and focusing the range of the angle of incidence of plasma light emitted from the inside of the chamber 110 and providing the plasma light to the monitor 140 may be further installed between the selection area light transmitter 130 and the monitor 140.

The condenser 160 may be formed of a specially processed concave lens. The concave lens may have a structure in which the curvature in the horizontal direction is larger than the curvature in the vertical direction. Accordingly, the condenser 160 may extend the range of the angle of incidence (B) of plasma light emitted from the inside of the chamber 110 to focus the plasma light.

That is, according to a conventional apparatus, only a portion of plasma light is collected through the optical cable 150, e.g., an optical fiber, of the monitor 140, as shown in FIG. 4A. On the other hand, according to one embodiment of the present disclosure, as shown in FIG. 4B, the condenser 160 is further provided in front of the monitor 140 to receive light in a wide area inside the chamber 110. Accordingly, the state of plasma may be uniformly analyzed from the center to the outermost part of a substrate W. Thus, this configuration may improve the performance of analyzing the plasma state. For example, to extend a range within which light in the chamber 110 is received, i.e., to increase the angle of incidence of plasma light, a specially processed concave lens may be inserted in the front of the monitor 140, thereby significantly increasing a light receiving angle (e.g., about 160° or more).

Figure 5A:
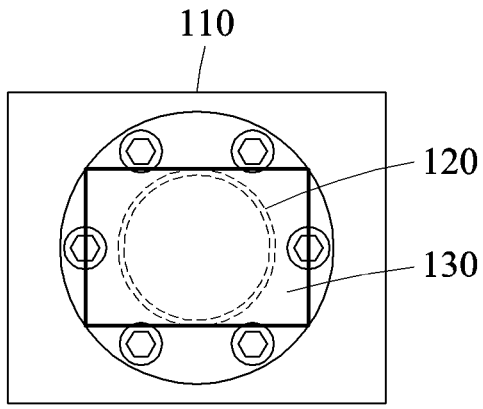
FIGS. 5A, 5B and 5C show various examples of installation of the selection area light transmitter shown in FIG. 1.
Figure 5B:
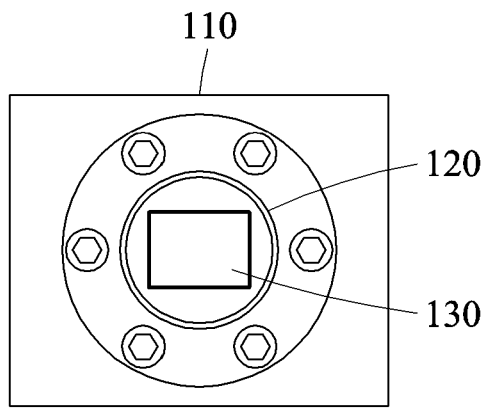
Figure 5C:
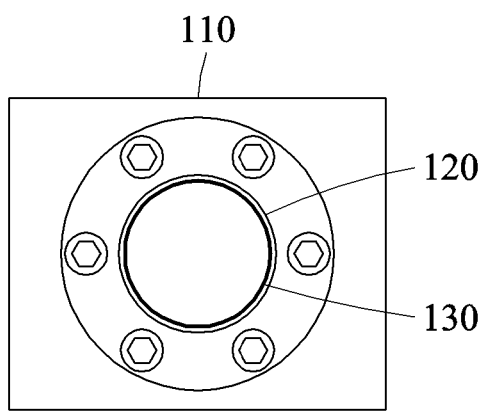
Figure 6:
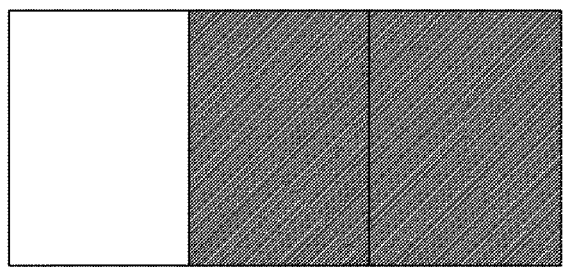
FIGS. 6 and 7 show examples of driving the selection area light transmitter shown in FIG. 1.
Figure 6:
Figure 6:
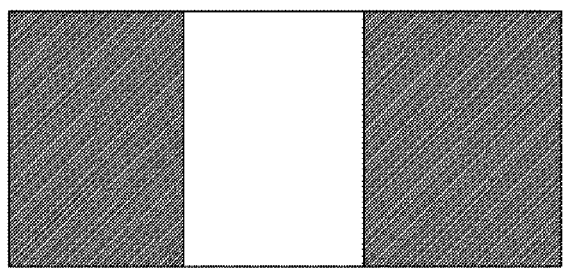
Figure 6:
Figure 6:
Figure 7:
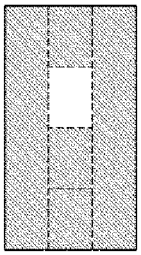

FIGS. 5A, 5B and 5C show various examples of installation of the selection area light transmitter shown in FIG. 1, and FIGS. 6 and 7 show examples of driving the selection area light transmitter shown in FIG. 1. The structure and operation of the selection area light transmitter will be described with reference to FIGS. 5A to 7.

As shown in FIGS. 5A, 5B and 5C, the selection area light transmitter 130 may be formed to be larger than the viewport 120 and spaced apart from the viewport 120 (see FIG. 5A), or may be formed to be smaller than the viewport 120 and mounted on one side of the viewport 120 (see FIG. 5B). Alternatively, the selection area light transmitter 130 may be formed to have the same size as the viewport 120 and be mounted on one surface of the viewport 120 (see FIG. 5C). In this case, the selection area light transmitter 130 may be disposed so that the center of the selection area light transmitter 130 coincides with the center of the viewport 120. When the selection area light transmitter 130 is mounted on one side of the viewport 120, one side of the selection area light transmitter 130 and one side of the viewport 120 may be in contact with each other, and these surfaces may be bonded or coupled to each other using an adhesive or a fastening tool so that the selection area light transmitter 130 and the viewport 120 can be integrated.

The selection area light transmitter 130 may be formed so that plasma light is transmitted through at least one of the selective light blockers 131. For example, as shown in FIG. 6, plasma light may be sequentially transmitted in one direction through the selective light blockers 131. When plasma light is transmitted in this manner, changes in the quantity of plasma light may be continuously monitored, and the uniformity of plasma may be continuously measured.

As shown in FIG. 7, the number of the selective light blockers 131 provided in the selection area light transmitter 130 may vary. In addition, the selective light blockers 131 may be disposed so that the entire area of the chamber 110 or only the central area of the chamber is measured. Here, plasma may be concentrated in the central area of the chamber 110, in which case only the central area of the chamber 110 may be measured.

For example, as shown in FIG. 7, when the selection area light transmitter 130 is provided with two selective light blockers 131, the selective light blockers 131 may be formed to alternately block transmission of plasma light through the right area of the selection area light transmitter 130 and transmission of plasma light through the left area of the selection area light transmitter 130. Accordingly, the intensities of plasma light respectively generated in the left and right areas of the chamber 110 may be compared with each other so that the uniformity of plasma distribution in the chamber 110 may be determined.

In addition, when the selection area light transmitter 130 is provided with three selective light blockers 131, the selection area light transmitter 130 may be set so that plasma light is alternately transmitted only through the selective light blocker 131 on the left side and the selective light blocker 131 on the right side. In this case, only the outer area of the chamber 110 may be measured. In addition, as shown in FIG. 6, the selection area light transmitter 130 may be set so that plasma light is sequentially transmitted through the selective light blockers 131. In this case, changes in the quantity of plasma light may be continuously measured. In addition, the selection area light transmitter 130 may be set so that plasma light is transmitted through the selective light blockers 131 in an arbitrary order rather than in a sequential order. In this case, the uniformity of plasma distribution may be measured by comparing the differences in light quantities.

In addition, when the selection area light transmitter 130 is provided with four selective light blockers 131, the selective light blockers 131 may be formed so that plasma light is alternately transmitted through the odd-numbered selective light blocker 131 and the even-numbered selective light blocker 131. In addition, even when the selection area light transmitter 130 is provided with four selective light blockers 131, the selection area light transmitter 130 may be set so that plasma light is alternately transmitted only through the left and right selective light blockers 131, or so that plasma light is sequentially transmitted. In addition, even when the selection area light transmitter 130 is provided with four selective light blockers 131, the selection area light transmitter 130 may be set so that plasma light is transmitted through the selective light blockers 131 in an arbitrary order rather than a sequential order. In this case, the uniformity of plasma distribution may be measured by comparing the differences in light quantities.

Figure 8:
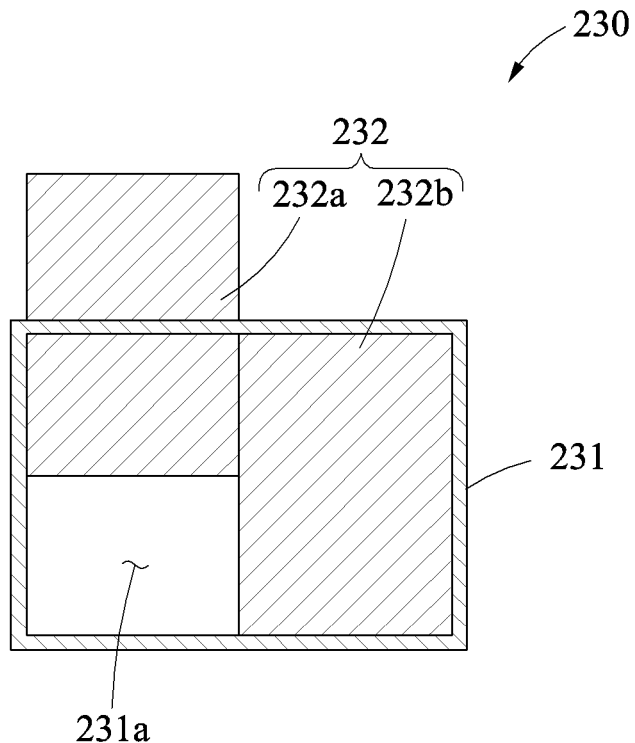
FIGS. 8 and 9 each show a block diagram of a selection area light transmitter according to another embodiment, which is included in the plasma process monitoring device of FIG. 1.
Figure 9:
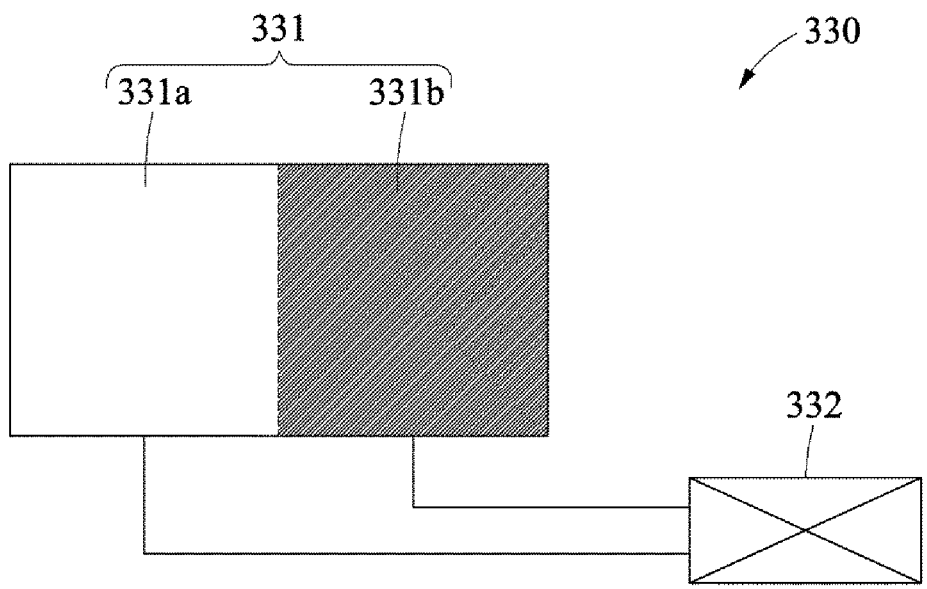

FIG. 8 shows a block diagram of a selection area light transmitter according to another embodiment, which is included in the plasma process monitoring device of FIG. 1. As shown in FIGS. 8 and 9, a selection area light transmitter 230 may include a frame 231 and shutter members 232.

The frame 231 may be disposed to face the viewport 120, and an opening 231a may be formed on one side thereof.

The shutter members 232 may be provided in plural and arranged in a line in the frame 231, and may selectively shield a certain area of the opening 231a. That is, the shutter members 232 may serve as a selective light blocker, and a driving motor for rotationally driving or linearly moving the shutter members 232 may be provided on one side of each of the shutter members 232. Accordingly, as shown in FIG. 8, in the case of the frame 231 provided with two shutter members 232a and 232b, when the shutter member 232b disposed on the right side is driven by the driving motor, the opening 231a formed on the right side is shielded, so that plasma light is not transmitted through the opening 231a formed on the right side and plasma light is transmitted only through the opening 231a formed on the left side. The size of the shutter members 232a and 232b is not limited, but the shutter members 232a and 232b are preferably formed to have a size allowing a minimum quantity of plasma light to pass therethrough.

Figure 10A:
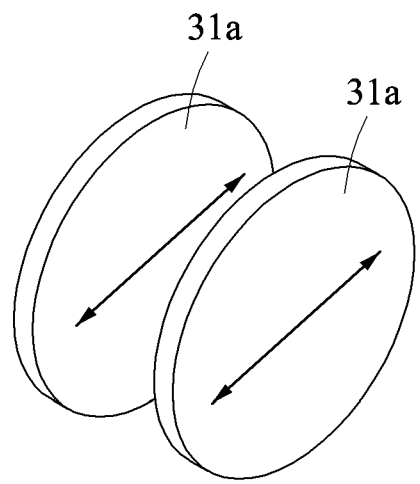
FIGS. 10A and 10B illustrate the set of polarizing filters shown in FIG. 9 in detail.
Figure 10B:
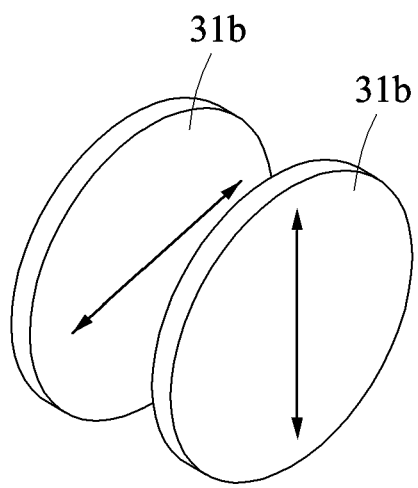

FIG. 9 is a block diagram of a selection area light transmitter according to another embodiment, which is included in the plasma process monitoring device of FIG. 1, and FIGS. 10A and 10B illustrate the set of polarizing filters shown in FIG. 9 in detail. As shown in FIGS. 9, 10A and 10B, a selection area light transmitter 330 may include a set of polarizing filters 331 and a controller 332.

The set of polarizing filters 331 may include at least two polarizing filter 31a and 31b arranged so as to overlap each other, and may be formed so that plasma light is selectively transmitted. When light vibrating in various directions encounters the polarizing filter 31a and 31b, only light vibrating in a specific direction may be transmitted through the polarizing filter 31a and 31b.

The controller 332 may selectively block transmission of plasma light through the polarizing filter 31a and 31b by controlling the angle of each of the polarizing filter 31a and 31b provided in the set of polarizing filters 331. Specifically, as shown in FIGS. 10A and 10B, when two sets of polarizing filters 331 are provided on the left and right sides, respectively, when the arrangement angle of each of polarizing filters 31b and 31b included in the set of polarizing filters 331b disposed on the right side is controlled by the controller 332 so that the polarizing filters 31b and 31b form a right angle with respect to each other (e.g., one is arranged to transmit vertically polarized light, and the other is arranged to transmit horizontally polarized light), plasma light incident on the set of polarizing filters 331b disposed on the right side may be blocked. When the arrangement angle of each of polarizing filters 31a and 31a included in the set of polarizing filters 331a disposed on the left side is controlled by the controller 332 so that the polarizing filters 31a and 31a are arranged in parallel (e.g., both are arranged to transmit vertically polarized light, or both are arranged to transmit horizontally polarized light), plasma light incident on the set of polarizing filters 331a disposed on the left side may be transmitted (see FIGS. 10A and 10B).

Figure 11A:
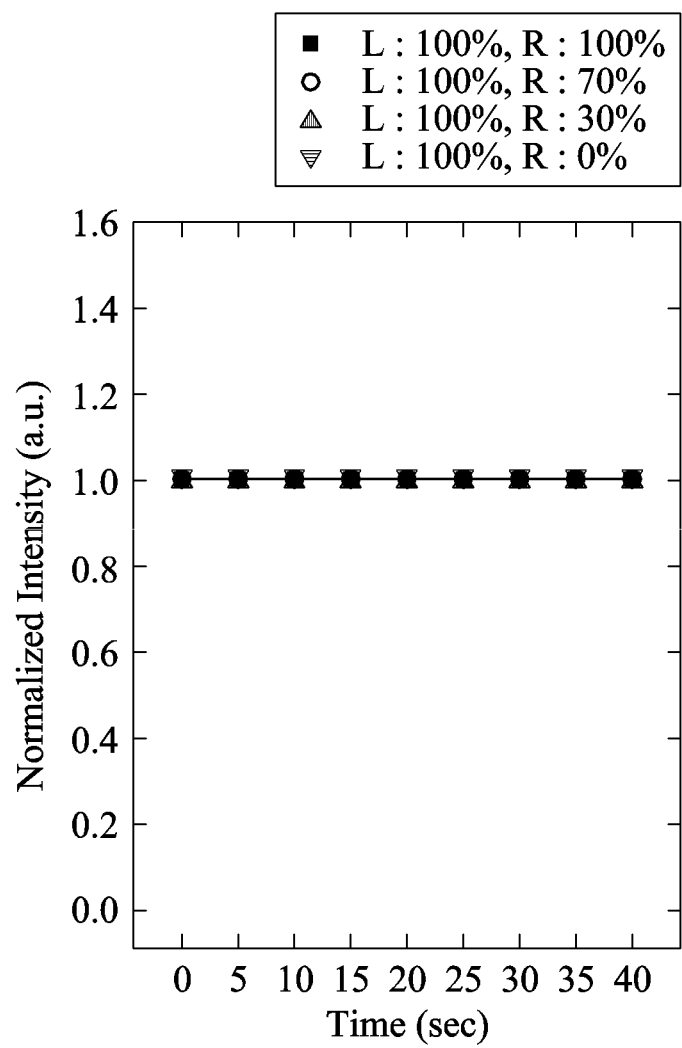
FIG. 11A is a graph showing plasma light intensities over time measured using a conventional plasma process monitoring device.

FIG. 11A is a graph showing plasma light intensities over time measured using a conventional plasma process monitoring device, and FIG. 11B is a graph showing plasma light intensities over time measured using a plasma process monitoring device according to the present disclosure including two selection area light transmitters.

As shown in FIG. 4A, in a conventional plasma process monitoring device 1, the selection area light transmitter 130 is not installed. Thus, all plasma light in the chamber 110 passes through the viewport 120 and is transmitted to the monitor 140. Accordingly, the conventional plasma process monitoring device 1 may not measure the uniformity of plasma distribution in the chamber 110.

On the other hand, referring to FIG. 10B, in the plasma process monitoring device 100 according to the present disclosure, the above-described selection area light transmitter 130 is installed. Therefore, the uniformity of plasma distribution in the chamber 110 may be measured by comparing the quantities of light in the left and right areas. In this case, it can be confirmed that, when plasma distribution is non-uniform, as the difference in the degree of opening in the left and right areas through which plasma light is transmitted increases, the difference in the quantity of light increases.

In addition, referring to FIG. 1, the monitor 140 may further include a photographing module 141 for photographing the arc discharge state of plasma light transmitted through the selective light blockers 131. The photographing module 141 may be a charge-coupled device (CCD) camera. When a photographed image has a pixel having a predetermined level or higher, the monitor 140 may determine that arc discharge has occurred in the photographed area, and may output this information to the outside.

As described above, since the plasma process monitoring device 100 includes the selection area light transmitter 130 disposed between the viewport 120 and the monitor 140 and for transmitting or blocking plasma light emitted through the viewport 120, the uniformity and arc discharge state of plasma generated in the chamber 110 during performance of plasma processing may be monitored.

In addition, upon determining that plasma uniformity is low through the monitor 140, a plasma process environment may be optimized by controlling plasma process conditions, so that the distribution of plasma becomes uniform. Thus, an excellent and highly reliable semiconductor substrate may be fabricated.

In addition, when an abnormal state of arc discharge is detected through the photographing module 141 of the monitor 140, the facility may be repaired or the amount of reaction gas may be adjusted to suppress occurrence of arc discharge. Therefore, damage to the substrate W fabricated in the chamber 110 may be prevented.

As shown in FIGS. 1 to 10B, a plasma processing apparatus 10 including the plasma process monitoring device includes the chamber 110, the viewport 120, the selection area light transmitter 130, and the monitor 140. In the present embodiment, differences from the above-described example will mainly be described.

The chamber 110 is a space where a plasma process is performed, and a chuck 111 on which the substrate W is placed may be installed in the chamber 110. Here, the substrate W may be a semiconductor substrate, a metal substrate, or a glass substrate. Treatment of the substrate W may be performed through an etching process, a chemical vapor deposition process, an ashing process, a cleaning process, or the like, without being limited thereto.

A gas feeder 113 may be provided on one side of the chamber 110, and the gas feeder 113 may be connected to the inside of the chamber 110 via a gas feed pipe 112. This configuration allows reaction gas for generating plasma to be fed into the chamber 110. As the reaction gas, inert gas such as argon (Ar) and nitrogen (N2) may be used.

Vacuum may be formed inside the chamber 110, and a vacuum unit 114 may be connected to one side of the chamber 110 for formation of vacuum. The vacuum unit 114 may include a vacuum pump, a control valve for adjusting pressure, and the like.

The viewport 120 is installed in the chamber 110, and plasma light emitted from the chamber 110 is transmitted to the outside of the chamber 110 through the viewport 120. Specifically, the viewport 120 may be disposed on a sidewall of the chamber 110, and may be provided with a window for observing the state inside the chamber 110 in which an etching process, a deposition process, or the like is performed. Accordingly, since plasma light generated inside the chamber 110 may be emitted to the outside through the viewport 120, whether plasma for performing an etching process or a deposition process is properly formed or whether the substrate W being processed is maintained in a stable may be confirmed from the outside.

The selection area light transmitter 130 may be disposed to face the viewport 120 formed in the chamber 110, and may include the selective light blockers 131 for selectively blocking plasma light emitted from the viewport 120.

The selection area light transmitter 130 may include the transparent LCD panel 131 and the switch 132, include the frame 231 and the shutter members 232, and include the set of polarizing filters 331 and the controller 332. Since the configuration of the selection area light transmitter 130 is the same as that described above, description thereof is omitted.

The monitor 140 receives plasma light transmitted through at least one of the selective light blockers 131 to acquire information on the received plasma light, and monitors the uniformity of plasma generated in the chamber 110 based on the acquired information on the plasma light. In this case, the information on plasma light may include information on the intensity and quantity of plasma light transmitted through the selective light blockers 131.

The operation of the plasma processing apparatus 10 including the plasma process monitoring device 100 will be described with reference to FIGS. 1 to 10B.

First, when the substrate W is placed on the chuck 111 in the chamber 110, vacuum is formed inside the chamber 110 by operation of the vacuum unit 114. In this state, reaction gas is fed into the chamber 110 by the gas feeder 113. Then, when a high-frequency current is applied to the inside of the chamber 110, the reaction gas is transformed into plasma, and an etching process, a deposition process, or the like may be performed.

When plasma is formed in this manner, light generated in plasma is transmitted to the selection area light transmitter 130 through the viewport 120. In this case, since the selection area light transmitter 130 is divided into several compartments by the selective light blockers 131, when the selective light blockers 131 are selectively shielded, the space in the chamber 110 is divided into predetermined areas, and only the information on plasma light generated in a certain area may be transmitted to the monitor 140.

For example, when the selection area light transmitter 130 is formed as the transparent LCD panel 131 having one LCD panel unit 31 divided into two areas 31a and 31b, power is selectively applied to the areas 31a and 31b by the switch 132 and light is transmitted only through the area 31a to which power is applied. That is, only plasma light supplied to the area 31a is transmitted, and the area 31b to which power is not supplied blocks light transmission. In addition, as shown in FIGS. 6 and 7, the switch 132 may be controlled so that plasma light is transmitted only through desired areas. That is, by controlling the switch 132, plasma light may be transmitted only through the central area or the outer area of the transparent LCD panel 131, plasma light may be alternately transmitted, or plasma light may be sequentially transmitted in one direction.

When plasma light is transmitted through at least one area 31a through the above process, the monitor 140 receives information on plasma light via the optical probe 151 and the optical cable 150. When the monitor 140 receives information on plasma light transmitted through each of the areas 31a and 31b of the LCD panel unit 31, plasma intensity may be measured for each area inside the chamber 110, and the monitor 140 may compare plasma intensities for these areas to determine the uniformity of plasma generated in the chamber 110.

In addition, the selection area light transmitter 130 may include the frame 231 and the shutter members 232 or the set of polarizing filters 331 and the controller 332, so that plasma light may be transmitted only through desired areas.

Through this process, plasma uniformity may be confirmed, so that deposition uniformity or etching uniformity for each region of the substrate W in the chamber 110 may be confirmed. That is, when plasma intensity is biased in one direction in the chamber 110, deposition or etching of a portion of the substrate W positioned in the plasma-concentrated area rapidly proceeds and deposition or etching of a portion of the substrate W positioned in the remaining area slowly proceeds. Accordingly, the thickness of the substrate W may be non-uniform.

Therefore, when abnormal distribution of plasma light is detected through the monitor 140, a plasma process environment may be optimized by controlling plasma process conditions. When the semiconductor substrate W is fabricated based on the optimized plasma process, an excellent and highly reliable semiconductor product may be realized.

In addition, the arc discharge state of the plasma light of a certain area, which has been transmitted through the selective light blockers 131, may be detected through the photographing module 141 of the monitor 140. When arc discharge is detected, the facility may be repaired or the amount of reaction gas may be adjusted to suppress occurrence of arc discharge. Therefore, damage to the substrate W fabricated in the chamber 110 may be prevented.

According to the present disclosure, the uniformity and arc discharge state of plasma generated in the chamber during performance of plasma processing can be monitored by including the selection area light transmitter disposed between the viewport and the monitor and for transmitting or blocking plasma light emitted from the viewport.

In addition, upon determining that the uniformity of plasma light is low through the monitor, a plasma process environment can be optimized by controlling plasma process conditions. Thus, an excellent and highly reliable semiconductor substrate can be fabricated.

In addition, when an abnormal state of arc discharge is detected through the photographing module of the monitor, occurrence of arc discharge can be suppressed by repairing the facility or adjusting the amount of reaction gas. Therefore, damage to a substrate fabricated in the chamber can be prevented.

Meanwhile, embodiments of the present disclosure disclosed in the present specification and drawings are only provided to aid in understanding of the present disclosure and the present disclosure is not limited to the embodiments. It will be apparent to those skilled in the art that various modifications can be made to the above-described exemplary embodiments of the present disclosure without departing from the spirit and scope of the disclosure. Therefore, the scope of the present disclosure should be defined only by the appended claims.

DESCRIPTION OF SYMBOLS

110: CHAMBER
120: VIEWPORT
130: SELECTION AREA LIGHT TRANSMITTER
131: SELECTIVE LIGHT BLOCKERS
131: TRANSPARENT LCD PANEL
132: SWITCH
140: MONITOR
141: PHOTOGRAPHING MODULE
150: OPTICAL CABLE
151: OPTICAL PROBE
160: CONDENSER
231: FRAME
231A: OPENING
232: SHUTTER MEMBERS
331: SET OF POLARIZING FILTERS
332: CONTROLLER

What is claimed is:

1. A plasma process monitoring device, comprising:
an optical probe;
a selection area light transmitter disposed to face a viewport formed in a chamber and comprising a plurality of selective light blockers for selectively blocking plasma light emitted through the viewport; and
a monitor for receiving plasma light transmitted through the optical probe and at least one of the selective light blockers to acquire information on the plasma light and monitoring uniformity of plasma generated in the chamber based on the information on the plasma light,
wherein the plasma light emitted through the viewport is divided by the selective light blockers and the plasma light is alternately blocked or transmitted so that intensity or quantity of plasma light for each area in the chamber can be measured,
wherein the selection area light transmitter is disposed between the viewport and the optical probe and includes a first side facing a side of the viewport and a second side facing the optical probe, wherein the optical probe, the selection area light transmitter and the viewport are arranged along a first direction, wherein the plurality of selective light blockers are arranged on a same plane along a second direction perpendicular to the first direction, and wherein a size of the first side of the selection area light transmitter is equal to or larger than a size of the side of the viewport, wherein each of the plurality of selective light blockers is formed of an LCD panel unit so that the selection area light transmitter includes a plurality of LCD panel units arranged along the second direction, each of the plurality of LCD panel units is powered individually, and the plasma light is transmitted only through an LCD panel unit of the plurality of LCD panel units to which power is supplied, wherein the plasma process monitoring device further comprises:

a switch connected to the plurality of LCD panel units for selectively supplying power to the plurality of LCD panel units, and a concave lens disposed between the selection area light transmitter and the optical probe for extending a range of an incidence angle of the plasma light emitted from the inside of the chamber and providing the extended range to the monitor, wherein the selection area light transmitter is in a rectangular shape extending in the second direction and in a third direction perpendicular to each of the first direction and the second direction, wherein the selection area light transmitter is configured to have an upper area, a central area and a lower area, each of the upper area, the central area and the lower area extending in the second direction, wherein the plurality of LCD panel units are disposed only along the central area extending in the second direction among the upper area, the central area and the lower area so that only a central area of the chamber is monitored by the monitor, wherein the number of the plurality of LCD panel units is 4 or more, and wherein the switch is configured to control the plurality of LCD panel units so that the plasma light from the chamber is alternately transmitted through odd-numbered LCD panel units and even-numbered LCD panel units among the plurality of LCD panel units disposed only along the central area extending in the second direction.

2. The plasma process monitoring device according to claim 1, wherein the information comprises intensity or quantity of plasma light transmitted through the selective light blockers.

3. The plasma process monitoring device according to claim 1, wherein the selection area light transmitter is formed on one surface of the viewport to be integrated with the viewport.

4. The plasma process monitoring device according to claim 1, wherein the monitor comprises an optical fiber or a measurement sensor to monitor intensity or quantity of plasma light.

5. The plasma process monitoring device according to claim 1, wherein the monitor comprises an optical emission spectroscope (OES) or a camera.

6. The plasma process monitoring device according to claim 1, wherein the monitor further comprises a camera for photographing an arc discharge state of plasma light transmitted through the selective light blockers.

7. A plasma processing apparatus, comprising:

a chamber in which a process using plasma is performed;

a viewport installed in the chamber and through which plasma light emitted from inside of the chamber is transmitted outside;

an optical probe;

a selection area light transmitter disposed to face the viewport and comprising a plurality of selective light blockers for selectively blocking plasma light emitted through the viewport; and a monitor for receiving plasma light transmitted through the optical probe and at least one of the selective light blockers to acquire information on the plasma light, and monitoring uniformity of plasma generated in the chamber based on the information, wherein the plasma light emitted through the viewport is divided by the selective light blockers and the plasma light is alternately blocked or transmitted so that the intensity or quantity of plasma light for each area in the chamber can be measured, wherein the selection area light transmitter is disposed between the viewport and the optical probe and includes a first side facing a side of the viewport and a second side facing the optical probe, wherein the optical probe, the selection area light transmitter and the viewport are arranged along a first direction, wherein the plurality of selective light blockers are arranged on a same plane along a second direction perpendicular to the first direction, and wherein a size of the first side of the selection area light transmitter is equal to or larger than a size of the side of the viewport, wherein each of the plurality of selective light blockers comprise is formed of an LCD panel unit so that the selection area light transmitter includes a plurality of LCD panel units arranged along the second direction, each of the plurality of LCD panel units is powered individually, and the plasma light is transmitted only through an LCD panel unit of the plurality of LCD panel units to which power is supplied, wherein the plasma processing apparatus further comprises:

a switch connected to the plurality of LCD panel units for selectively supplying power to the plurality of LCD panel units, and a concave lens disposed between the selection area light transmitter and the optical probe for extending a range of an incidence angle of the plasma light emitted from the inside of the chamber and providing the extended range to the monitor, wherein the selection area light transmitter is in a rectangular shape extending in the second direction and in a third direction perpendicular to each of the first direction and the second direction, wherein the selection area light transmitter is configured to have an upper area, a central area and a lower area, each of the upper area, the central area and the lower area extending in the second direction, wherein the plurality of LCD panel units are disposed only along the central area extending in the second direction among the upper area, the central area and the lower area so that only a central area of the chamber is monitored by the monitor, wherein the number of the plurality of LCD panel units is 4 or more, and wherein the switch is configured to control the plurality of LCD panel units so that the plasma light from the chamber is alternately transmitted through odd-numbered LCD panel units and even-numbered LCD panel units among the plurality of LCD panel units disposed only along the central area extending in the second direction.

8. The plasma processing apparatus according to claim 7, wherein the information comprises intensity or quantity of plasma light transmitted through the selective light blockers.

* * * * *